United States Patent [19]

Ishikawa

[11] Patent Number: 5,146,220
[45] Date of Patent: Sep. 8, 1992

[54] DATA CONVERSION METHOD AND APPARATUS FOR CONVERTING UNDEFINED LENGTH DATA TO FIXED LENGTH DATA

[75] Inventor: Yuji Ishikawa, Yokohama, Japan

[73] Assignee: Canon Kabushiki Kaisha, Tokyo, Japan

[21] Appl. No.: 679,320

[22] Filed: Apr. 2, 1991

[30] Foreign Application Priority Data

Apr. 5, 1990 [JP] Japan .................................. 2-89233

[51] Int. Cl.⁵ .............................................. H03M 7/40
[52] U.S. Cl. ........................................ 341/67; 341/95; 341/60
[58] Field of Search ...................... 341/60, 67, 81, 95

[56] References Cited

U.S. PATENT DOCUMENTS

| 4,593,267 | 6/1986 | Kuroda et al. | 341/67 |
| 4,819,079 | 4/1989 | Takao | 358/260 |
| 4,914,675 | 4/1990 | Fedele | 341/67 X |
| 4,963,867 | 10/1990 | Bertrand | 341/60 |

Primary Examiner—Marc Hoff
Attorney, Agent, or Firm—Fitzpatrick, Cella, Harper & Scinto

[57] ABSTRACT

A data conversion method and an apparatus for the same which converts undefined-length image signal coded by a MH or MR method for facsimile equipment, etc. into fixed-length data. Coded undefined-length image data is inputted, and, in accordance with a bit length contained in the image data and with the number of the effective bits in the last byte, bits to be outputted from a barrel shifter are shifted. Control is performed to byte pack the bits of the last byte and the shifted bits outputted from the barrel shifter, and coded data is converted into data in byte units, thereby enabling high-speed byte packing.

9 Claims, 9 Drawing Sheets

DATA CONVERSION METHOD AND APPARATUS FOR CONVERTING UNDEFINED LENGTH DATA TO FIXED LENGTH DATA

BACKGROUND OF THE INVENTION

1. Field of the Invention

The present invention relates to a data conversion method and an apparatus for the same which converts an undefined-length image signal, coded by a modified Huffman coding (MH) or modified READ coding (MR) method for facsimile equipment, etc., into fixed-length data.

2. Description of the Related Art

Figure 2:
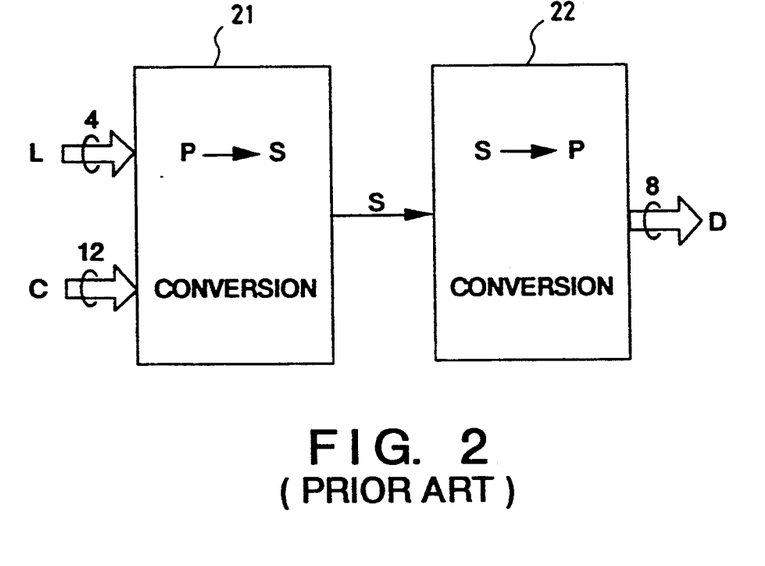
FIG. 2 is a block diagram showing the arrangement of a conventional circuit.

A conventional data conversion circuit of the above described type has, as shown in FIG. 2, a parallel-serial conversion section (P→S conversion) 21 for inputting, as a piece of input data, an undefined-length code comprising a bit pattern C and a code length L, for converting the data into certain serial data S, and for outputting the data S, and a serial-parallel conversion section (S→P conversion) 22 for converting the serial data S into fixed-length parallel data D having the desired length, and for outputting the data D. The conventional circuit is thus arranged to convert an undefined-length code obtained by a MH or MR method into a fixed-length byte pack.

However, some MH codes have a maximum code length of 13 bits. If such a code is to be converted into serial data by the conventional data conversion circuit, at least 13 clock pulses are necessary. As a result, the conventional circuit requires a long time for the conversion process, and thus fails to perform byte packing at high speeds.

SUMMARY OF THE INVENTION

The present invention has been made to overcome the above-described problem. An object of the present invention is to provide a data conversion method and an apparatus for the same which are capable of high-speed byte packing.

Another object of the present invention is to provide a data conversion method and an apparatus for the same which convert code data coded by a MH or MR method for facsimile equipment, etc. into byte data at high speeds.

Other objects of the present invention will become apparent from the following detailed description when the same is read in connection with the accompanying drawings.

DESCRIPTION OF THE PREFERRED EMBODIMENTS

One preferred embodiment of the present invention will now be described with reference to the accompanying drawings.

Figure 1:
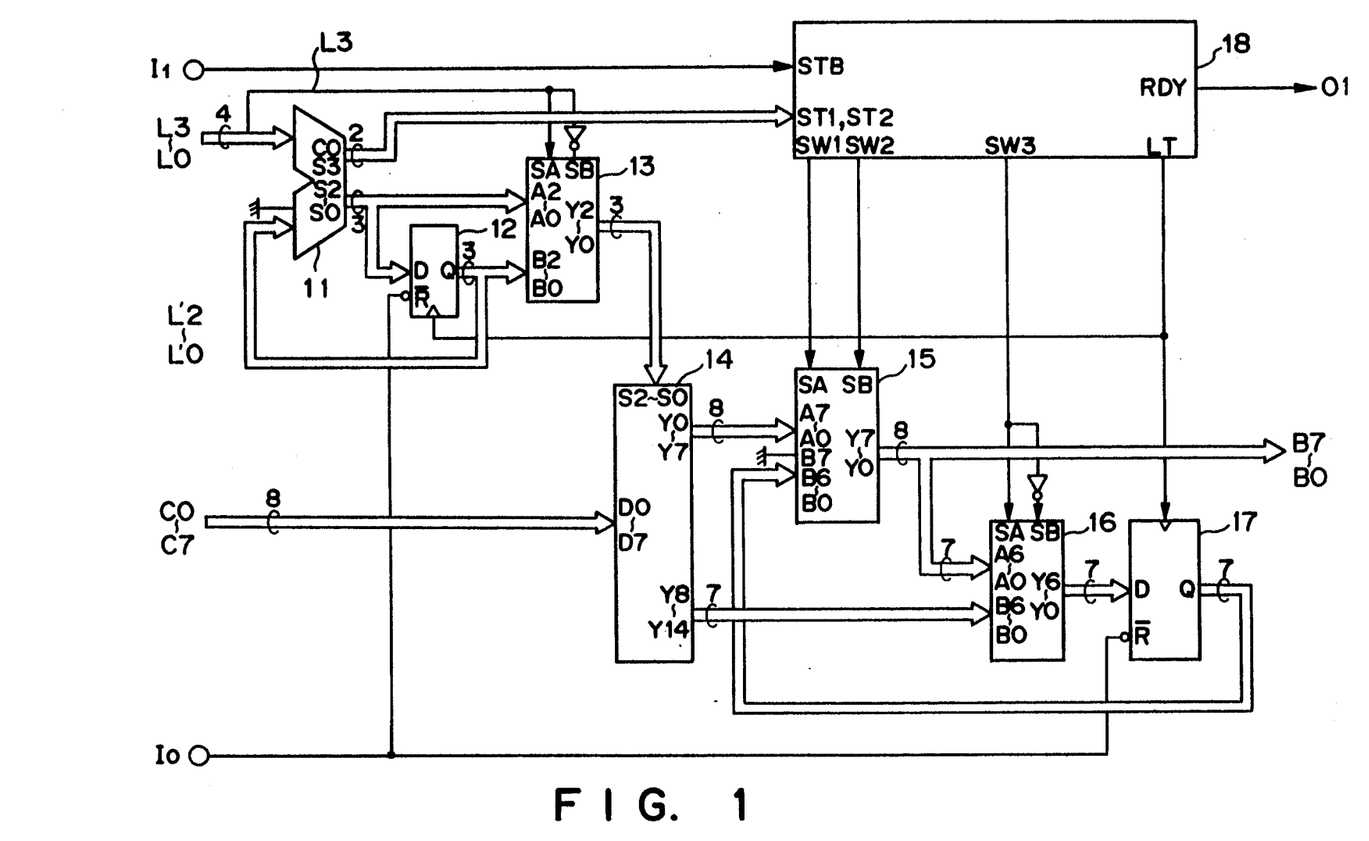
FIG. 1 is a block diagram showing the arrangement of a circuit in an embodiment of the present invention.
Figure 3:
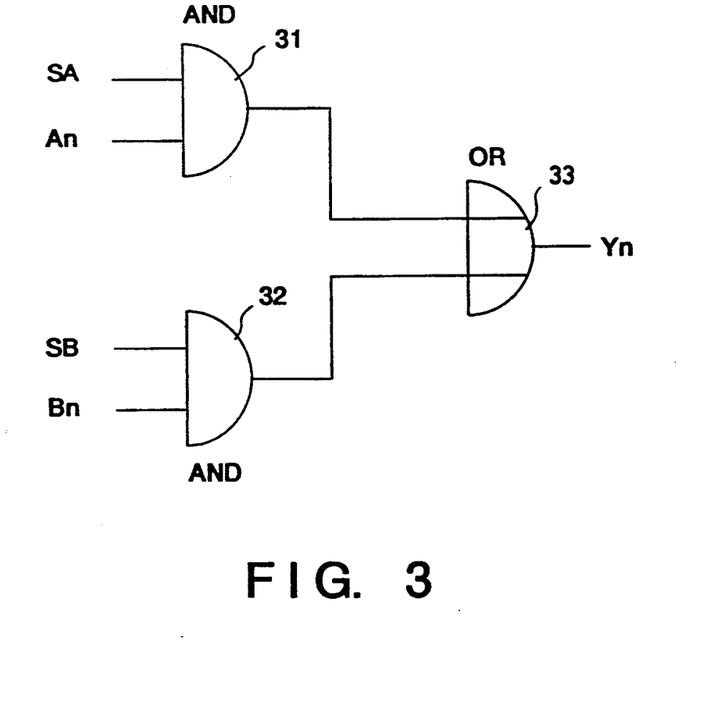
FIG. 3 is a view showing details of the arrangement of a selector circuit.
Figure 4A:
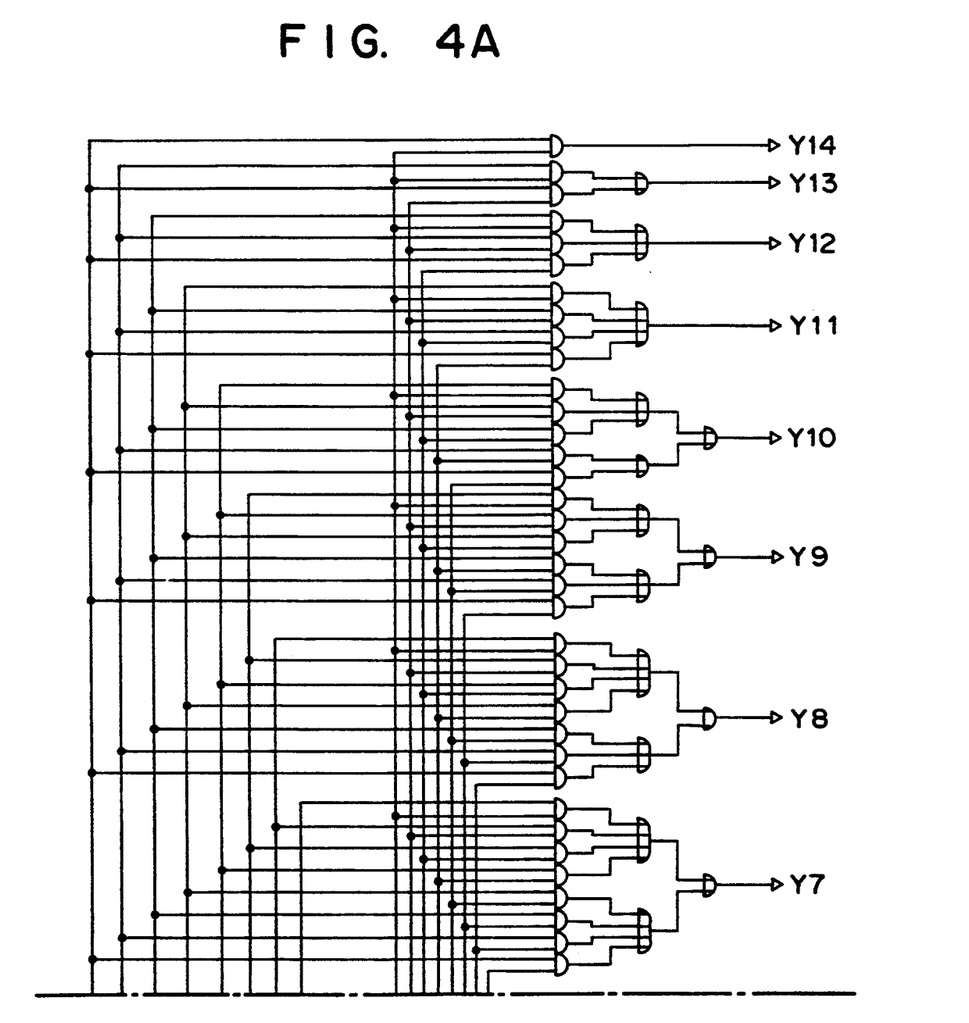
FIG. 4A and 4B are views showing the circuit arrangement of a parallel shifter used in the embodiment.
Figure 4B:
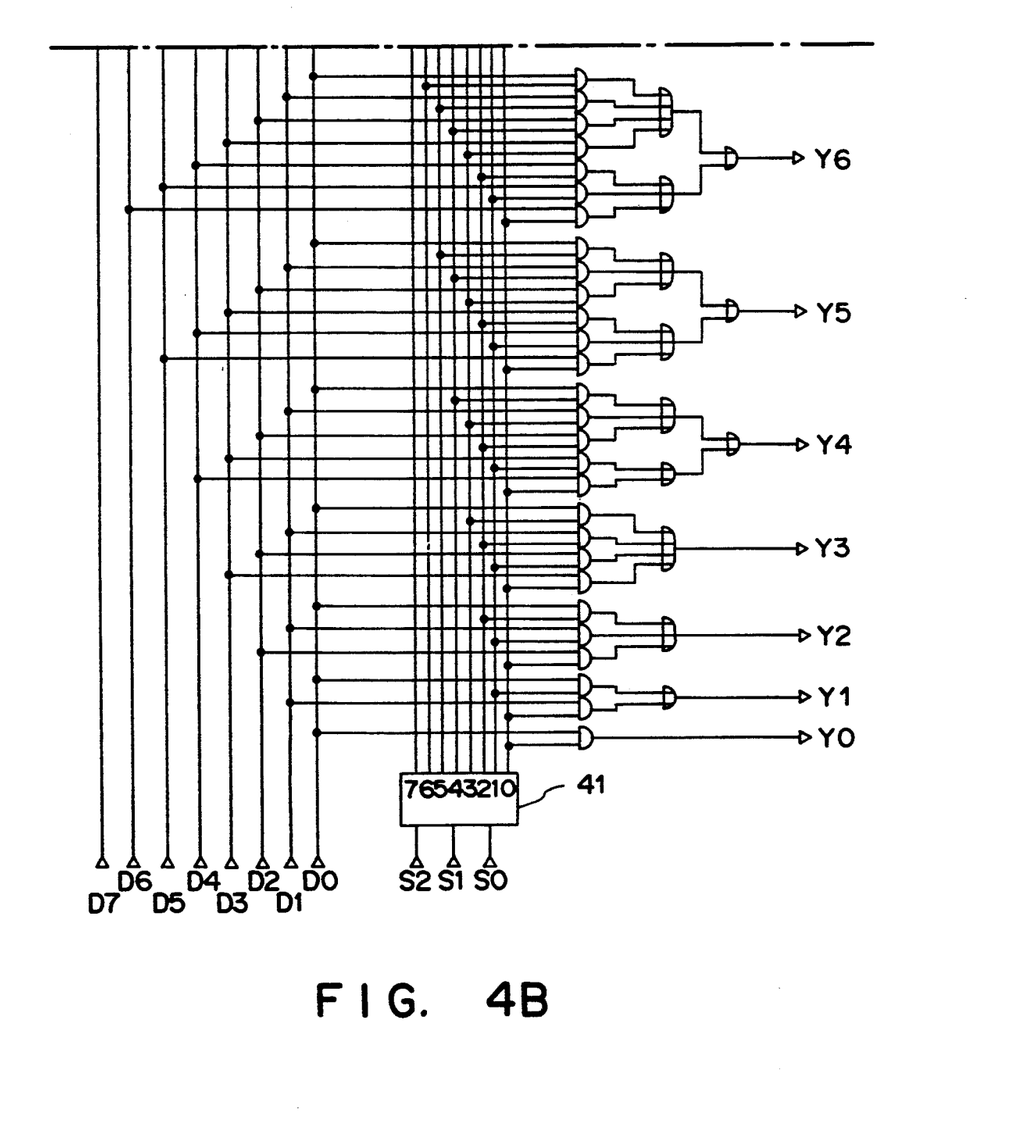

Description of Construction (FIGS. 1, 3 and 4)

FIG. 1 shows, in a block diagram, the arrangement of a circuit in this embodiment. Referring to FIG. 1, the circuit includes a 4-bit adder 11 which produces a carry output C0 and outputs S3~S0 indicative of the result of an addition by the adder 11. A 3-bit- D-type flip-flop (register) 12 temporarily stores a value representing the number of the effective bits in a 7-bit register 17, described later. A selector 13 has three selector circuits each comprising, as shown in FIG. 3, AND circuits 31 and 32 and an OR circuit 33. The selector 13 selects either a 3-bit input A0~A2 or a 3-bit input B0~B2 in accordance with the L3 bit (SA/SB) of code length data, described later.

A barrel shifter circuit 14 is a circuit which, as shown in detail in FIG. 4A and 4B, operates on parallel 8-bit input data D7~D0 to parallel-shift it in accordance with the value of control input data S2~S0 to selected ones of outputs Y14 ~Y0. As shown in FIG. 4A and 4B, the circuit 14 includes an element 41 for decoding the binary inputs S2~S0, and for assuming the level "1" at one of eight active-high output terminals. For instance, if the control input data S2~S0 is "1 0 0", the input data D7~D0 is output as outputs Y11~Y4, with the other outputs being "0".

An 8-bit selector 15 has eight selector circuits each being the as the selector circuit shown in FIG. 3. A 7-bit selector 16 has seven selector circuits each being the same as the selector circuit shown in FIG. 3. The 7-bit register 17 temporarily holds a coded data string of less than 8 bits which was in the last byte of a coded data string subjected to byte-packing. A control section 18 controls the timing of the operation of the above-described sections 11 to 17.

A strobe signal Il is a signal input to the control section 18, which signal indicates that the data input to the circuit is effective. Code length data L3~L0 indicates the one-code length of a Code obtained by a MH or MR method which is currently inputted. A code C7~C0 obtained by a MH or MR method is inputted in the following manner: when the code is a code of 7 bits or less, the input bit pattern is led by the least significant bit (LSB), and any empty bits in the pattern are "0"; whereas when the code is a code of 8 bits or more, the input bit pattern is ended by the most significant bit A reset input signal I₁ is input to the respective flip-flops shown as the registers 12 and 17. Denoted by B7~B0 is coded data which has been byte-packed. A strobe clock O₁ is a signal indicating that the coded data output B7~B0 is effective.

The control section 18 has two inputs ST2 and ST1 which respectively consist of the carry output C0 and the result of addition S3, both output by the 4-bit adder 11. The section 18 outputs output-selection signals SW1 and SW2 to the selector 15, and a selection signal SW3 to the selector 16. Also, a data update clock LT is supplied from the control section 18 to the registers 12 and 17.

Figure 5:
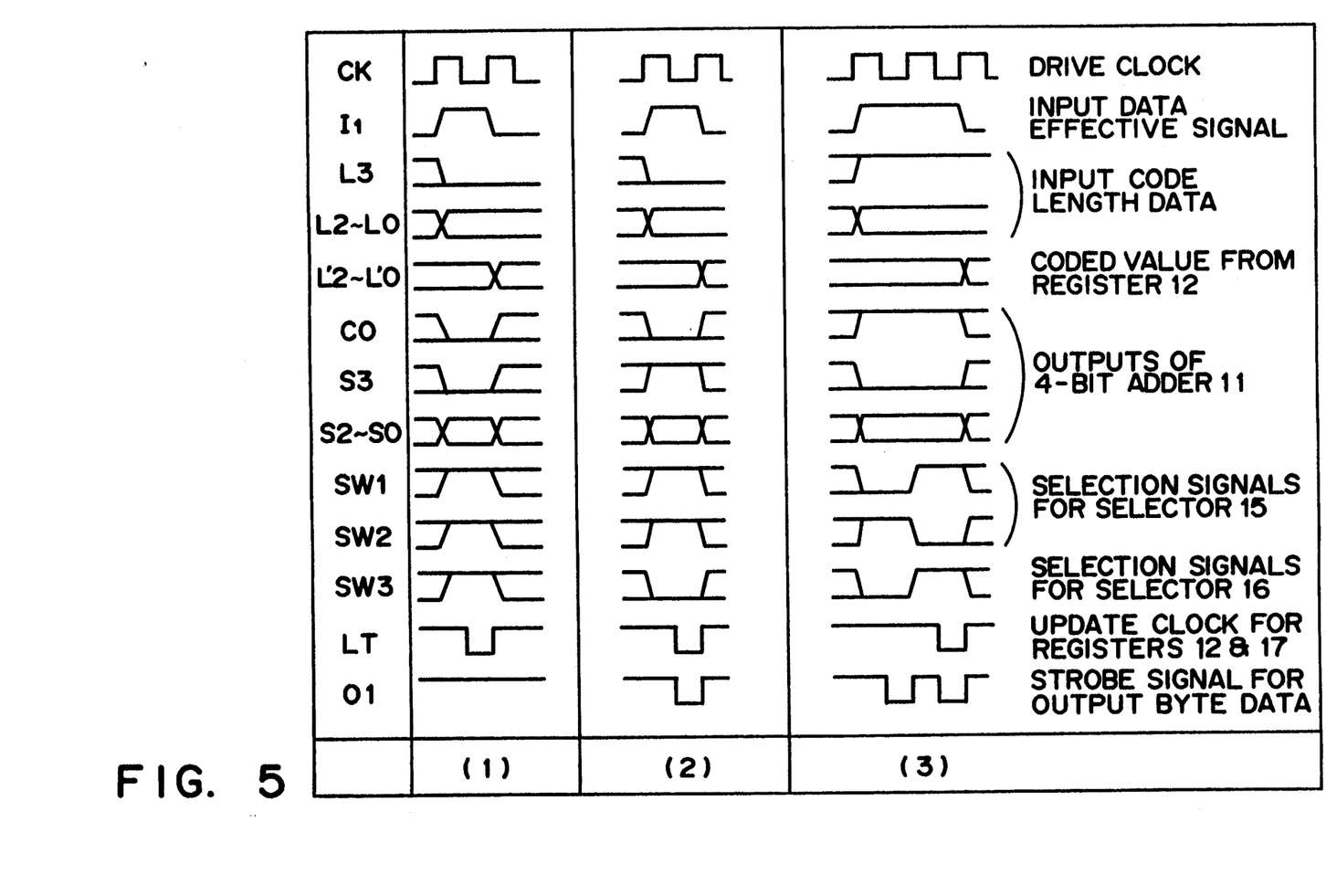
FIG. 5 is a timing chart for explaining the operation in the embodiment.
Figure 6:
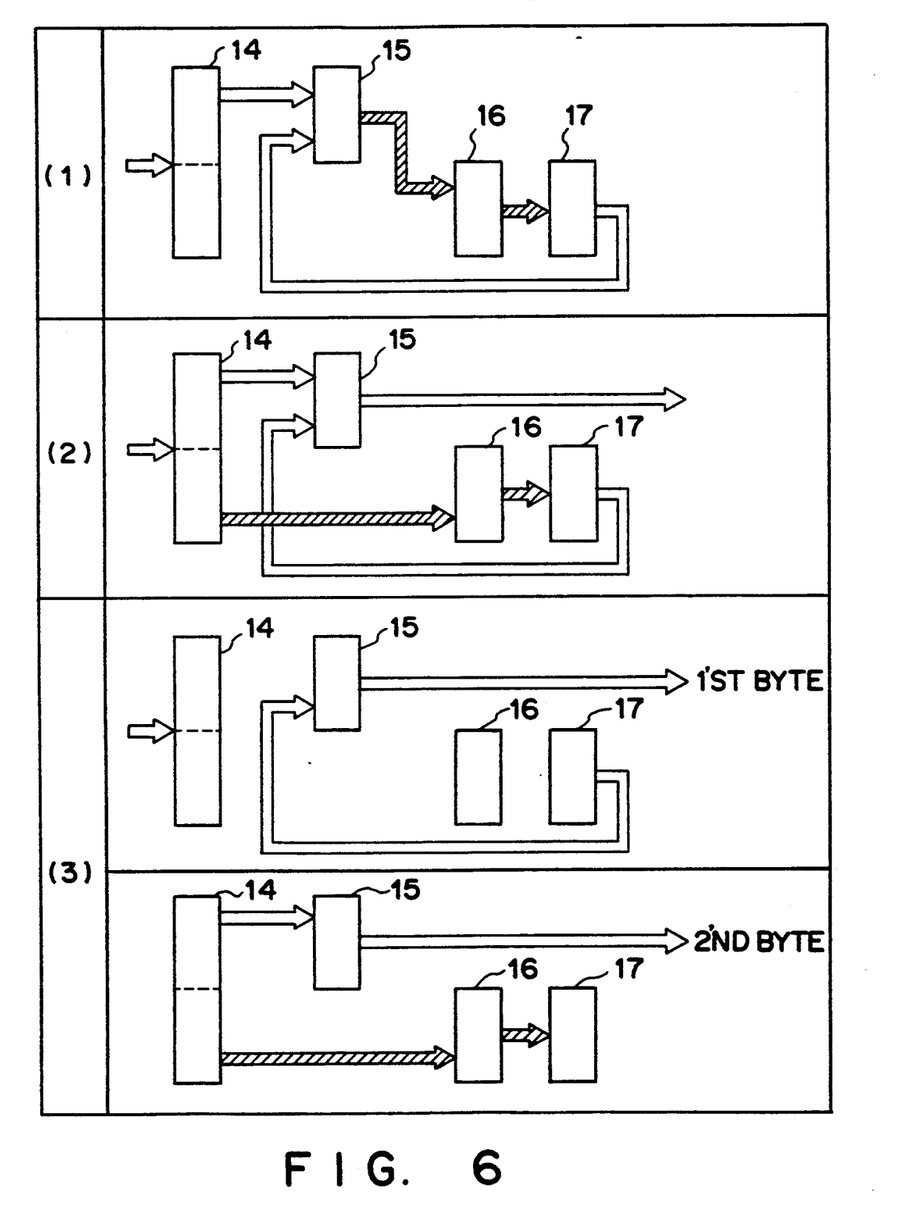
FIG. 6 shows data flow for explaining the operation in the embodiment.
Figure 7:
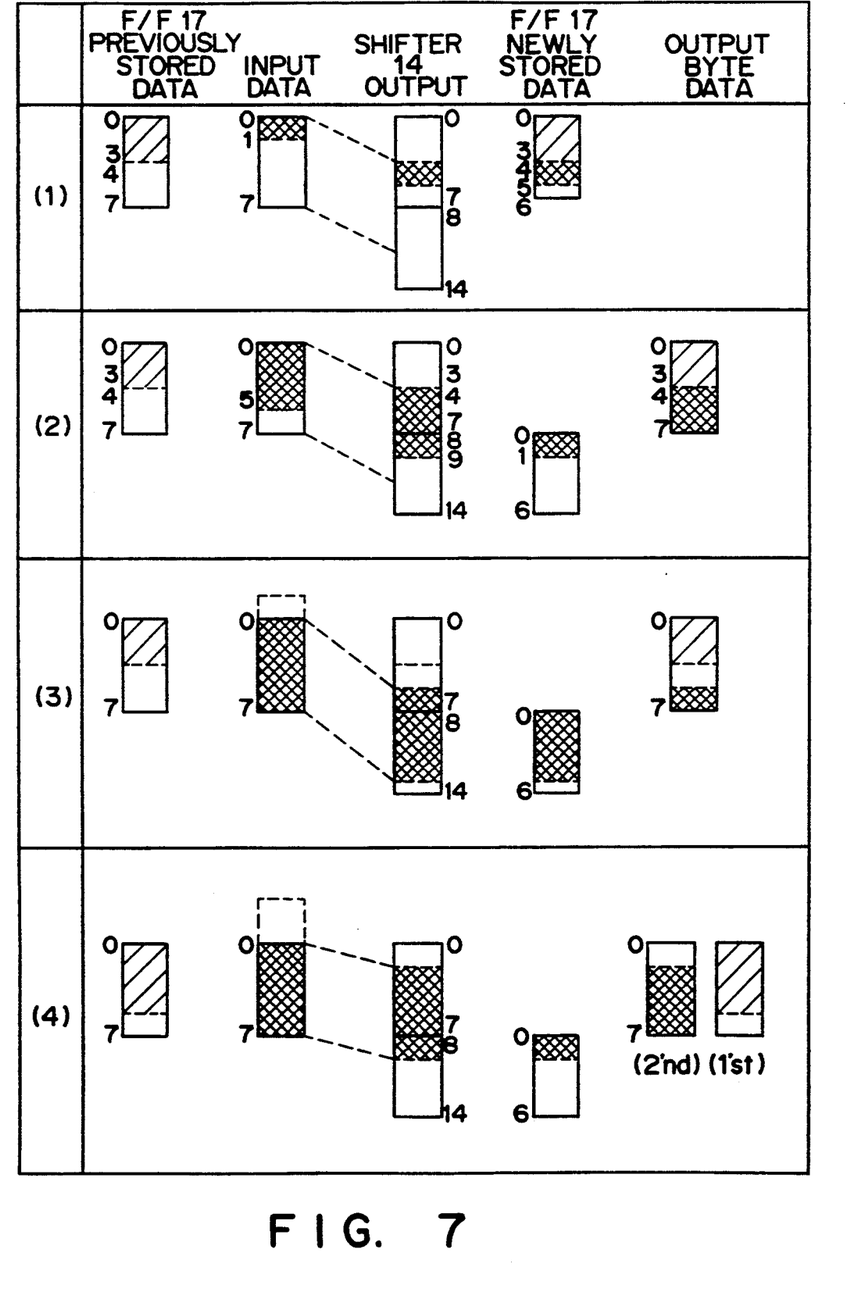
FIG. 7 is a view for explaining the concepts of the operation in the embodiment.

Description of Operation (FIGS. 5 to 7)

The operation of this embodiment will be described below with reference to FIGS. 5 to 7.

FIG. 5 is a timing chart of the above-described circuit, FIG. 6 shows the data flow in the embodiment, and FIG. 7 shows the outline of the operation of the embodiment.

Codes obtained by a MH or MR method, each of which is an image coding method used in facsimile equipment, have a one-code length of 13 bits at most. However, all such codes with a code length of 9 bits or more have bit patterns which are characterized by the following fact: if 8 bits starting with the last bit of the bit pattern are removed, the remainder of the bit pattern is always a "0" portion. Based on this fact, this embodiment employs a certain input code format for one code, which comprises a 4-bit code-length field and an 8-bit bit-pattern field, in other words, 12 bits in total.

With this format, in inputting a code having a one-code length of 8 bits or less, the bit 0 of said bit pattern field is made to correspond with the leading bit of the code, and any empty bits are expressed as "0". In inputting a code having a one-code length of 9 bits or more, the bit 7 of said bit pattern field is made to correspond with the last bit of the code, and an 8-bit string of the code which comprises the last bit and 7 others closer to the leading bit are expressed in accordance with the bit pattern.

More specifically, when such coded data is input as an input signal, and a continuous sequence of codes is to be divided into byte units, there are four possible cases of operation, as shown in FIG. 7.

FIG. 7 (1) shows an example of a first case where the result of adding the number $L2' \sim L0'$ of the effective bits in the last byte (from register 12) to the length $L3 \sim L0$ of the input code is less than 8.

If, for example, the number $L2' \sim L0' = 4$ and the length $L3 \sim L0 = 2$, since $L3 = 0$ the selector 13 selects the data $L2' \sim L0'$. As a result, the input code data $C1 \sim C0$ appears as outputs Y5 and Y4 of the barrel shifter 14. Here, the control section 18 supplies the selector 15 with selection signals SW1 and SW2 both at the level "1", and also supplies the selector 16 with a selection signal SW3 at the level "1". As a result, the register 17 is supplied with an input consisting of data to be newly stored, in which the bits 0 to 3 express the previous code and the bits 4 and 5 express the input code.

The register 12 has already inputted, from the adder 11, the result of adding the effective bit number $L2' \sim L0'$ to the input code length $L3 \sim L0$, performed by the adder 11. When a latch signal LT is inputted to the registers 12 and 17, the contents of these two registers are updated.

In the above-described operation, data flows through the paths as shown in FIG. 6 (1). In FIG. 6, reference numerals 4 to 17 respectively denote the same components as those shown in FIG. 1, and the hatched parts represent the flow of updated data. Various signals generated in the operation are shown in FIG. 5 (1).

FIG. 7 (2) shows an example of a second case where the input code length $L3 \sim L0 < 8$ and, simultaneously, the sum of this input code length $L3 \sim L0$ and the effective bit number $L2' \sim L0'$ satisfies the relationship of $8 \leq (L3 \sim L0) + (L2' \sim L0') \leq 15$.

If, for example, the number $L2' \sim L0' = 4$ and the length $L3 \sim L0 = 6$, the selector 13 outputs, as in the case (1), the data $L2' \sim L0'$. As a result, the input code data $C5 \sim C0$ is output by the barrel shifter 14 as outputs $Y9 \sim Y4$. The control section 18 determines that, on the basis of the carry output $C0 = 0$ and on the basis of the result $S3 \sim S0 = 10$ ($1010_B$) the addition $(L2' \sim L0') + (L3 \sim L0)$, it is possible to output code data of one byte.

Here, the control section 18 supplies a signal SW1 = 1 and a signal SW2 = 1 to the selector 15, so that a one-byte code, in which the bits 0 to 3 express the previous code and the bits 4 to 7 express $C0 \sim C3$ of the input code data $C5 \sim C0$, is outputted as byte outputs $B7 \sim B0$. Simultaneously, a signal SW3 = 0 is supplied from the control section 18 to the selector 16, so that the register 17 is supplied with data on the basis of which C4 and C5 is corresponded to the bits 0 and 1 of the register 17. On the other hand, the register 12 is supplied with the lower three bits ($010_B$) of the result of the addition of the code length and the effective bit number. Upon a latch signal LT, the respective contents of the registers 12 and 17 are updated.

In the above-described operation, the data flows through the paths shown in FIG. 6 (2), and various signals are generated as shown in FIG. 5 (2).

FIG. 7 (3) shows an example of a third case where $8 \leq L3 \sim L0 \leq 15$ and, simultaneously, $8 \leq (L3 \sim L0) + (L2' \sim L0') \leq 15$. The input code $C7 \sim C0$ originally includes a "0" portion, which is omitted, as indicated by the broken lines in the column "INPUT DATA".

If, for example, $L2' \sim L0' = 100_B$ and $L3 \sim L0 = 1010_B$, since $L3 = 1$, the output $S0 \sim S2$ from the adder 11 appears at the output of the selector 13. As a result, the input code $C7 \sim C0$ is outputted by the barrel shifter 14 as outputs $Y13 \sim Y6$. Thus, at this point, the omitted "0" portion originally included in the input code is inserted as a part of the output of the shifter 14.

The control section 18 determines that, on the basis of the result S3 = 1 of the addition by the adder 11 and on the basis of the carry output $C0 = 0$, it is possible to output the input code $C7 \sim C0$ as byte-packed, 1-byte code data.

When signals SW1 = 1, SW2 = 2 and SW3 = 0 are supplied to the respective selectors 15 and 16, the OR of the contents of the register 17 and the output from the output terminals $Y7 \sim Y0$ of the barrel shifter 14 is obtained as the output of the selector 15, while the output from the output terminals $Y14 \sim Y8$ of the barrel shifter 14 is outputted as the output Y6 to Y0 of the selector 16. In this condition, a signal $O_1$ indicates that the output data $B7 \sim B0$ is effective. A latch signal LT is supplied to update the contents of the registers 12 and 17.

In the above-described operation, the paths of data flow and the signals generated are the same as those shown in FIG. 6 (2) and FIG. 5 (2), respectively.

FIG. 7 (4) shows an example of a fourth case where $8 \leq L3 \sim L0 \leq 15$ and, simultaneously, $16 \leq (L3 \sim L0) + (L2' \sim L0')$. In such cases, a two-byte code is output by byte-packing.

Descriptions will be given of an example of the fourth case, in which $L3 \sim L0 = 1100_B$ and $L2' \sim L0' = 110_B$.

Since the input data is such that L3 = 1, the selector 13 selects, as its output, the output of the adder 11. On the basis of the other output of the adder 11 in which $C0 = 1$ and $S3 = 0$, the control section 18 determines that it is possible to output a second byte of the output code data.

For the outputting of a first byte, the control section 18 supplies a signal SW1=0 and a signal SW2=1 to the selector 15. As a result, only the contents of the register 17 is output as outputs B7~B0. Subsequently, for the outputting of a second byte, the control section 18 supplies a signal SW1=1, a signal SW2=0 and a signal SW3=0 to the respective selectors 15 and 16. As a result, outputs B7~B0 consist only of the outputs Y7~Y0 of the barrel shifter 14, while the output of the selector 16 consists of the output from the output terminals Y14~Y8 of the barrel shifter 14.

In this condition, a latch signal LT, serving as a data update clock, is supplied to the registers 12 and 17 so as to update the respective contents of these registers.

The data flow and various signals in the above-described operation are shown in FIG. 5 (3) and FIG. 6 (3), respectively.

In the prior art, since parallel-serial conversion is performed, at least one drive clock is needed for one code-bit, and at least an 8-clock processing time is needed to output code data of one byte. In contrast, according to this embodiment, it is possible to produce one-byte code data with one drive clock, thereby enabling high-speed conversion of a code obtained by a MH or MR method into byte data.

Furthermore, the circuit arrangement according to this embodiment is suitable for large scale integration.

Figure 8A:
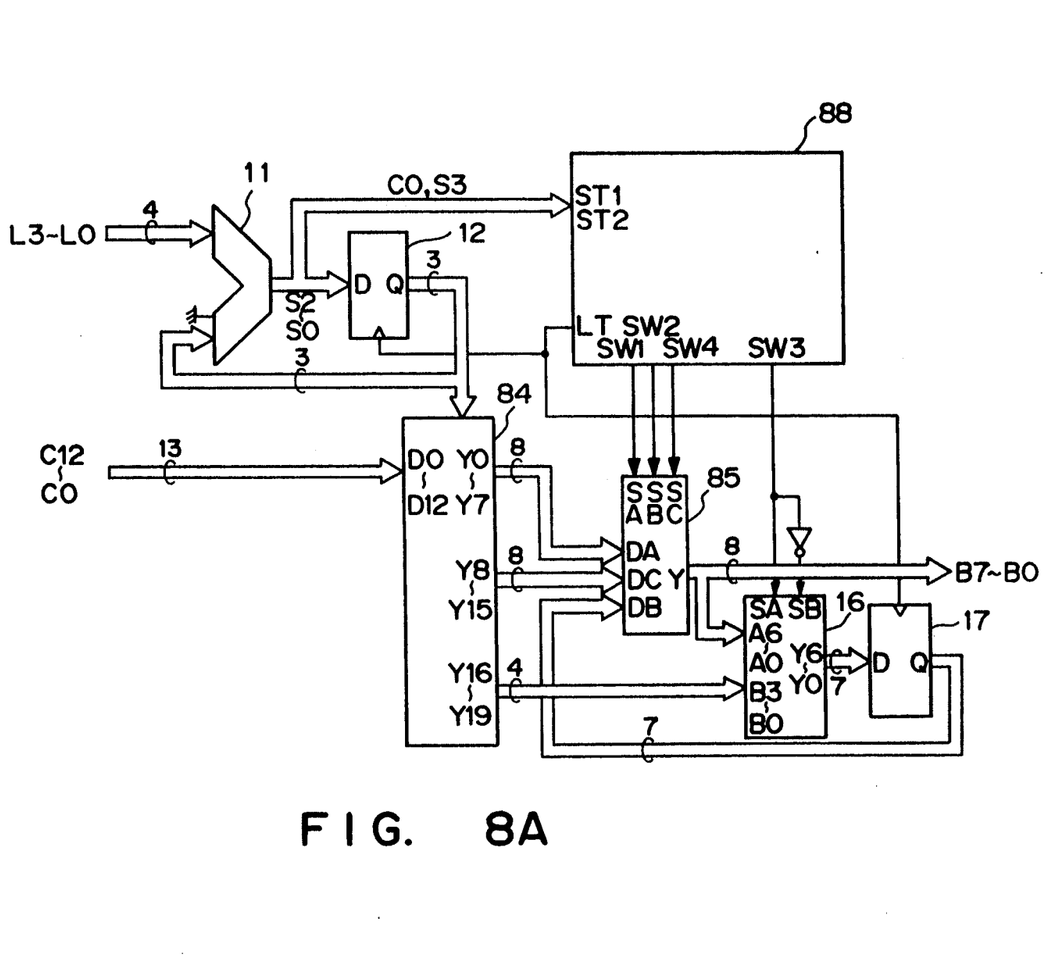
FIGS. 8A and 8B, and FIG. 9 are views showing the arrangements in other embodiments of the present invention.
Figure 8B:
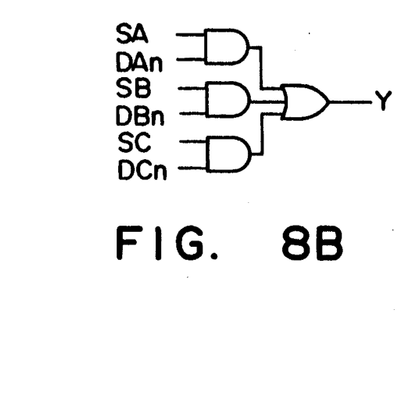
Figure 9:
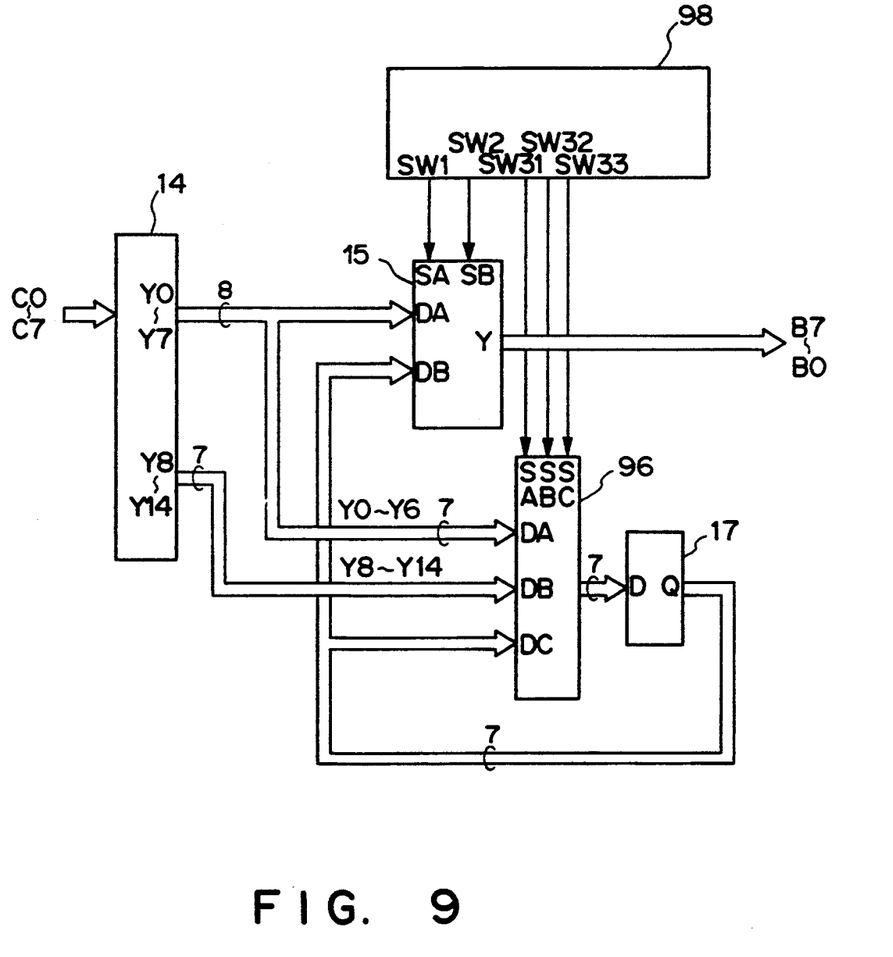

Other Embodiments (FIGS. 8A, 8B and FIG. 9)

In the above-described embodiment, when the input code length exceeds 8 bits, the bit pattern of the code is inputted in such a manner that an 8-bit string C7~C0 from the last bit is inputted. In contrast, if the method is modified so that the entire bit pattern is inputted, a circuit arrangement such as that shown in FIG. 8A may be adopted, and, in this circuit, the selector 13 shown in FIG. 1 is unnecessary. When the maximum code length is 13 bits, a barrel shifter 84 must have output terminals for 20 bits. A selector 85 is a three-input selector, as shown in FIG. 8B, so as to enable operations similar to those in the foregoing embodiment.

In the arrangement shown in FIG. 1, the input A6~A0 of the selector 16 consists of the output Y6~Y0 of the selector 15. However, similar operations and effect to those in the first embodiment can be achieved if a selector 96 is composed of a three-input selector, as shown in FIG. 9, and three inputs, namely, the outputs Y6~Y0, Y8~Y14 (both of the barrel shifter 14) and the output of the register 17, are directly inputted to the selector 96.

As described above, according to the present invention, it is possible to provide a data conversion circuit capable of high-speed byte packing operations.

Although the present invention has been described in its preferred form, it is to be understood that the invention is not limited to the specific embodiments thereof, and that various changes and modifications may be made without departing from the spirit and scope of the invention as hereinafter claimed.

What is claimed is:

1. A data conversion apparatus for converting undefined-length codes into fixed-length data, wherein all codes of the undefined-length codes having a code length greater than or equal to n+1 bits have all of the bits thereof except n bits from the least significant bit (LSB) the same, comprising:

first input means for directly inputting the undefined-length code in which the code length is less than or equal to n bits, and for inputting only n bits from the LSB of the undefined-length code in which the code length is more than or equal to n+1 bits;

second input means for inputting code length data representing the code length of the undefined-length code inputted from said first input means, and for shifting and outputting a bit position of the output undefined-length code;

first hold means for holding residual data which could not be converted into fixed-length data by a previous conversion;

second hold means for holding residual length data of the residual data held by said first hold means;

conversion means for converting the undefined-length code into fixed-length data by packing the undefined-length code outputted from said shift-output means and the residual data held at said first hold means; and control means for controlling a shift-number of the bit position shifted by said shift-output means in accordance with the code length data inputted from said second input means and the residual length data held at said second hold means.

2. A data conversion apparatus according to claim 1, wherein the undefined-length code is a code obtained by a MH or MR method, and is a bit pattern in which bits except 8 bits from the LSB are "0" if the code length is greater than or equal to 9 bits.

3. A data conversion apparatus according to claim 1, wherein said first input means inputs the undefined-length code in parallel.

4. A data conversion apparatus according to claim 3, wherein said first input means inputs an 8-bit bit pattern in parallel.

5. A data conversion apparatus according to claim 1, wherein said shift-output means comprises a barrel shifter.

6. A data conversion apparatus according to claim 1, wherein said control means comprises adding means for adding the code length data to the residual length data and selecting means for selecting either the data from said adding means or the residual length data in accordance with the code length data, and said control means controls the shift-number of the bit position shifted by said shift-output means in accordance with the data selected by said selecting means.

7. A data conversion apparatus according to claim 6, wherein said conversion means performs the conversion in accordance with the data from said adding means.

8. A data conversion apparatus according to claim 1, wherein said second input means inputs a 4-bit code length data.

9. A data conversion apparatus according to claim 1, wherein said conversion means converts the undefined-length code into n-bit length data.

* * * * *